United States Patent
Kim et al.

(10) Patent No.: US 11,481,217 B2
(45) Date of Patent: Oct. 25, 2022

(54) DATA TRANSMITTING AND RECEIVING SYSTEM INCLUDING CLOCK AND DATA RECOVERY DEVICE AND OPERATING METHOD OF THE DATA TRANSMITTING AND RECEIVING SYSTEM

(71) Applicant: SAMSUNG ELECTRONICS CO., LTD., Suwon-si (KR)

(72) Inventors: Kyoungho Kim, Hwaseong-si (KR); Changsik Yoo, Seoul (KR); Baekjin Lim, Seoul (KR)

(73) Assignees: SAMSUNG ELECTRONICS CO., LTD., Suwon-si (KR); IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 17/241,159

(22) Filed: Apr. 27, 2021

(65) Prior Publication Data
US 2021/0342151 A1    Nov. 4, 2021

(30) Foreign Application Priority Data
Apr. 29, 2020 (KR) .......................... 10-2020-0052890

(51) Int. Cl.
*H04L 25/34* (2006.01)
*H04L 25/49* (2006.01)
(Continued)

(52) U.S. Cl.
CPC .............. *G06F 9/3016* (2013.01); *G06F 1/10* (2013.01); *G06F 9/30029* (2013.01); *H03L 7/0807* (2013.01); *H03L 7/091* (2013.01)

(58) Field of Classification Search
CPC ...... G06F 9/3016; G06F 9/30029; G06F 1/10; H03L 7/0807; H03L 7/091;
(Continued)

(56) References Cited

U.S. PATENT DOCUMENTS 6,148,040 A    11/2000  Nguyen et al.
6,169,638 B1 *  1/2001  Morling .................. H03G 3/30
(Continued)

FOREIGN PATENT DOCUMENTS

CN    110447146    11/2019
KR    10-0799683    1/2008

OTHER PUBLICATIONS

Office Action dated Oct. 22, 2021 in corresponding Application No. TW Patent Appln. No. 110115308.
(Continued)

*Primary Examiner* — Phuong Phu
(74) *Attorney, Agent, or Firm* — F. Chau & Associates, LLC

(57) ABSTRACT

A data transmitting and receiving system includes a first device including an encoder configured to encode row data to generate precoding data and a transmitter configured to transmit the precoding data through a transmission channel and a second device including an integrator configured to perform an integral on the precoding data, an integral sampler including a plurality of samplers configured to output sampling data based on an offset value and an output value of the integrator, a decoder configured to decode outputs of some of the samplers to generate decoded data, and a phase detector configured to detect a phase difference between the precoding data and a clock based on the decoded data and an output of another one of the samplers.

20 Claims, 10 Drawing Sheets

(51) Int. Cl.
*G06F 9/30* (2018.01)
*G06F 1/10* (2006.01)
*H03L 7/08* (2006.01)
*H03L 7/091* (2006.01)

(58) Field of Classification Search
CPC ........... H04L 25/4906; H04L 25/03885; H04L 25/03146; H04L 7/0331; H04L 25/497; H04L 7/0334; H03G 3/30; H03M 5/18
USPC ....... 375/291, 290, 293, 294, 373, 375, 376, 375/287
See application file for complete search history.

(56) References Cited

U.S. PATENT DOCUMENTS

| | | | |
|---|---|---|---|
| 6,377,642 B1* | 4/2002 | Dollard | ................ H04L 7/0334 375/354 |
| 7,403,149 B2 | 7/2008 | Kim | |
| 7,920,796 B2 | 4/2011 | Brownlee et al. | |
| 8,861,667 B1 | 10/2014 | Zerbe et al. | |
| 8,989,303 B2 | 3/2015 | Dally | |
| 9,215,107 B1 | 12/2015 | De Bernardinis | |
| 9,565,041 B2 | 2/2017 | Palmer | |
| 9,596,108 B2 | 3/2017 | Iyer et al. | |
| 2005/0002475 A1* | 1/2005 | Menolfi | ................ H04L 25/497 375/340 |
| 2005/0024253 A1* | 2/2005 | Adamiecki | ............. H03M 5/18 341/169 |
| 2005/0058234 A1* | 3/2005 | Stojanovic | ............ H04L 7/0331 375/371 |
| 2005/0166040 A1 | 7/2005 | Walmsley | |
| 2010/0054383 A1 | 3/2010 | Mobin et al. | |
| 2010/0150289 A1* | 6/2010 | Sunaga | ............... H04L 25/4906 375/354 |
| 2010/0327924 A1* | 12/2010 | Hasegawa | ......... H04L 25/03885 327/155 |
| 2014/0140389 A1* | 5/2014 | Chen | ................ H04L 25/03146 375/233 |

OTHER PUBLICATIONS

Hyun-Wook Lim, et al., "A 5.8-Gb/s Adaptive Integrating Duobinary DFE Receiver for Multi-Drop Memory Interface", IEEE Journal of Solid-State Circuits, vol. 52, No. 6, Jun. 2017, pp. 1563-1575.

Jaeduk Han et al., "Design Techniques for a 60-Gb/s 288-mW NRZ Transceiver With Adaptive Equalization and Baud-Rate Clock and Data Recovery in 65-nm CMOS Technology", IEEE Journal of Solid-State Circuits, vol. 52, No. 12, Dec. 2017, pp. 3474-3485.

* cited by examiner

FIG. 6A

| $D_{TX}$ | 0 | 0 | 1 | 1 | 0 | 1 | 0 | 1 | 1 | 0 | 0 |
|---|---|---|---|---|---|---|---|---|---|---|---|
| $V_{INTGE} / V_{INTGO}$ | | −1 | 0 | 0 | 0 | 0 | 0 | 0 | 1 | 0 | −1 |
| $H_E / H_O$ | | 1 | 1 | 1 | 1 | 1 | 1 | 1 | 0 | 1 | 1 |
| $L_E / L_O$ | | 0 | 1 | 1 | 1 | 1 | 1 | 1 | 1 | 1 | 0 |
| $D_E / D_O$ | 0 | 0 | 1 | 0 | 1 | 0 | 1 | 0 | 1 | 0 | 0 |

FIG. 6B

| $D_{TX}$ | | 0 | 1 | 1 | 0 | 1 | 0 | 1 | 1 | 0 | 0 |
|---|---|---|---|---|---|---|---|---|---|---|---|
| $D_{PRE}$ | 0 | 0 | 1 | 0 | 0 | 1 | 1 | 0 | 1 | 1 | 1 |
| $V_{INTGE} / V_{INTGO}$ | | −1 | 0 | −1 | −1 | 0 | 1 | 1 | 0 | 1 | 0 |
| $H_E / H_O$ | | 1 | 1 | 1 | 1 | 1 | 0 | 0 | 1 | 0 | 1 |
| $L_E / L_O$ | | 0 | 1 | 0 | 0 | 1 | 1 | 1 | 1 | 1 | 1 |
| $D_E / D_O$ | | 0 | 1 | 0 | 0 | 1 | 0 | 0 | 1 | 0 | 1 |

FIG. 8

| $V_{INTG}[n-2]$ | $V_{INTG}[n-1]$ | $V_{INTG}[n]$ | E/L/H |
|---|---|---|---|
| +1 | +1 | 0(+) | Early |
| +1 | 0(+) | −1 | Early |
| 0(+) | −1 | −1 | Early |
| 0(+) | 0(−) | +1 | Early |
| +1 | 0(+) | 0(−) | Early |
| 0(+) | −1 | 0(−) | Early |
| −1 | −1 | 0(−) | Early |
| −1 | 0(−) | +1 | Early |
| 0(−) | +1 | +1 | Early |
| 0(−) | 0(+) | −1 | Early |
| −1 | 0(−) | 0(+) | Early |
| 0(−) | +1 | 0(+) | Early |
| +1 | +1 | 0(−) | Late |
| +1 | 0(−) | −1 | Late |
| 0(−) | −1 | −1 | Late |
| 0(−) | 0(+) | +1 | Late |
| +1 | 0(−) | 0(+) | Late |
| 0(−) | −1 | 0(+) | Late |
| −1 | −1 | 0(+) | Late |
| −1 | 0(+) | +1 | Late |
| 0(+) | +1 | +1 | Late |
| 0(+) | 0(−) | −1 | Late |
| −1 | 0(+) | 0(−) | Late |
| 0(+) | +1 | 0(−) | Late |
| Otherwise | | | Hold |

DATA TRANSMITTING AND RECEIVING SYSTEM INCLUDING CLOCK AND DATA RECOVERY DEVICE AND OPERATING METHOD OF THE DATA TRANSMITTING AND RECEIVING SYSTEM

CROSS-REFERENCE TO RELATED APPLICATION

This U.S. non-provisional patent application claims the benefit of priority under 35 U.S.C. § 119 to Korean Patent Application No. 10-2020-0052890, filed on Apr. 29, 2020, in the Korean Intellectual Property Office, the disclosure of which is incorporated by reference in its entirety herein.

TECHNICAL FIELD

The inventive concept relates to a clock and data recovery device and a data transmitting and receiving system including the same, and more particularly, to a device for recovering a baud rate clock and data, using duo-binary signaling.

DISCUSSION OF RELATED ART

A baud rate phase detector is less complex, uses less power and has a smaller area than an oversampling-based timing recovery circuit. Accordingly, a baud rate phase detector is widely used in a high-speed serial link.

An operation of a phase detector of a data and clock recovery device is performed based on random jitter and dithering. However, the operation has a problem due to randomness of the random jitter and accordingly, cannot used for a low data rate.

When an integral is performed on data, a high frequency component has a characteristic that is robust to noise. However, it needs to be determined whether a slope of a value obtained through the integral has increased or decreased before it can be used for recovering a clock signal and data. A separate phase interpolation circuit may be used to determine whether the slope increases or decreases. However, the additional circuit increases the complexity of the phase detector and results in the phase detector using more power.

Thus, there is a need for a clock and data recovery device that does not require a separate phase interpolation circuit.

SUMMARY

At least one embodiment of the inventive concept provides a clock and data recovery device which transmits precoding data and uses a pattern of an integral-performed duo-binary signal, and thus, prevents the propagation of an error and improves an accuracy in determining the earliness or lateness of a clock.

According to an exemplary embodiment of the inventive concept, there is provided a data transmitting and receiving system including a first device including an encoder configured to encode row data to generate precoding data and a transmitter configured to transmit the precoding data through a transmission channel and a second device including an integrator configured to perform an integral on the precoding data, an integral sampler including samplers configured to output sampling data based on an offset value and an output value of the integrator, a decoder configured to decode outputs of some of samplers to generate decoded data, and a phase detector configured to detect a phase difference between the precoding data and a clock based on the decoded data and an output of another one of the samplers.

According to an exemplary embodiment of the inventive concept, there is provided an operating method of a data transmitting and receiving system including a first device and a second device. The operating method includes encoding, the first device transmitting precoding data encoded from row data, an integrator of the second device performing an integral on the precoding data, samplers of the second device generating sampling data based on an output value of the integrator and an offset value, a decoder of the second device decoding outputs of some of the samplers to generated decoded data, and the second device detecting a phase difference between the precoding data and a clock based on the decoded data and an output of another one of the samplers.

BRIEF DESCRIPTION OF THE DRAWINGS

Embodiments of the inventive concept will be more clearly understood from the following detailed description taken in conjunction with the accompanying drawings in which:

FIG. 6A illustrates an example where error propagation occurs;

FIG. 6B illustrates an example where error propagation does not occur, according to embodiments of the inventive concept;

FIG. 8 illustrates a table for determining the delay or absence of delay of a clock in a phase detector according to embodiments of the inventive concept.

DETAILED DESCRIPTION OF THE EXEMPLARY EMBODIMENTS

Hereinafter, embodiments will be described in detail with reference to the accompanying drawings.

Figure 1:
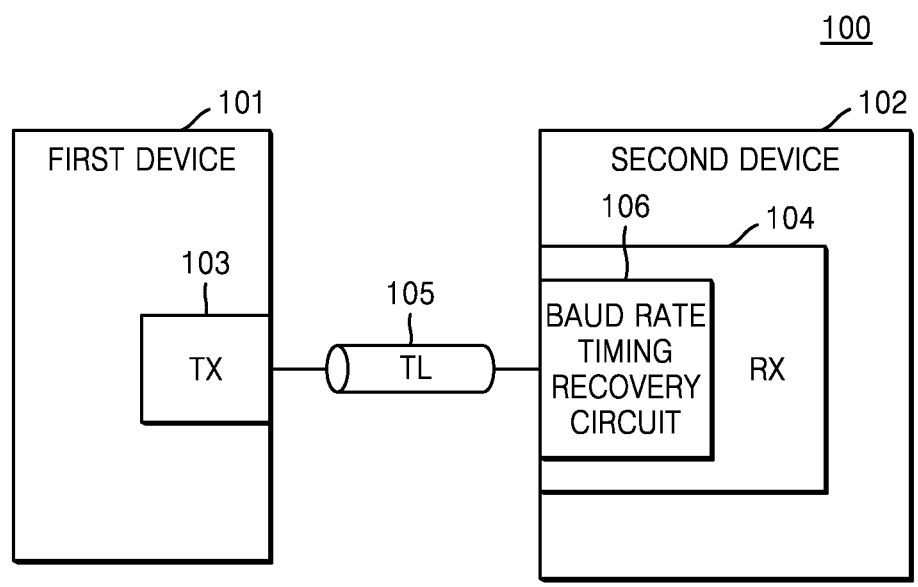
FIG. 1 illustrates a data transmitting and receiving system including a clock and data recovery device, according to an exemplary embodiment of the inventive concept.

FIG. 1 illustrates a data transmitting and receiving system 100 including a clock (e.g., a baud rate clock) and data recovery device, according to an exemplary embodiment of the inventive concept. The data transmitting and receiving system 100 may referred to as a transceiver.

Referring to FIG. 1, the data transmitting and receiving system 100 includes a first device 101, a second device 102, and a transmission line 105. The first device 101 may be a main element for transmitting data. The first device 101 includes a transmitter 103 for transmitting the data to the second device 102 through the transmission line 105. In an embodiment, the first device 101 transfers the data to the second device 102. In another embodiment, the first device 101 performs a separate encoding on the data to generate encoded data and transmits the encoded data to the second device 102. In an embodiment, the first device 101 includes an encoder (e.g., an encoder circuit) to perform the encoding.

The second device 102 may be a main element for receiving the data. The second device 102 includes a receiver 104 for receiving the data from the first device 101 through the transmission line 105. In an embodiment, the second device 102 further includes a decoder (e.g., a decoder circuit) for decoding the encoded data. In various embodiments, the first device 101 may be referred to as a transmitting end, and the second device 102 may be referred to as a receiving end. In an embodiment, the second device 102 further includes a baud rate timing recovery circuit 106 for locking a baud rate clock or baud rate clock signal. The baud rate timing recovery circuit 106 will be described below in detail with reference to FIG. 3. In an exemplary embodiment, the second device 102 is implemented or located within a receiving end (e.g., input circuit) of a processor or processing unit.

In various embodiments, the transmission line 105 may be referred to using various terms including a transmission channel and a data channel. The transmission line 105 may have a predefined data rate. For example, the transmission line 105 may transmit data of 10 Gigabit (Gbit) every second (or 10 Gbps).

Figure 2:
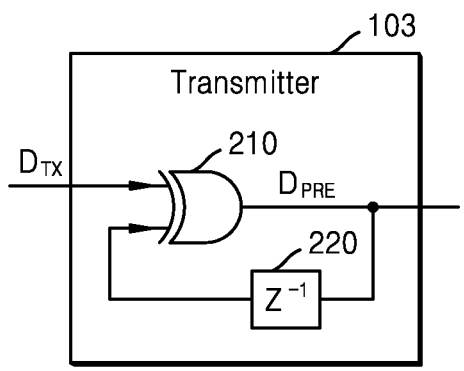
FIG. 2 illustrates a transmitter of the system according to an exemplary embodiment of the inventive concept.

FIG. 2 illustrates the transmitter 103 of the first device 101 according to an exemplary embodiment of the inventive concept. In an exemplary embodiment, the first device 101 is implemented or located within an output end (e.g., an output circuit) of a dynamic random-access memory (DRAM).

Referring to FIG. 2, the transmitter 103 of the first device 101 includes an XOR gate 210 and a delay block 220 (e.g., a delay circuit). $D_{TX}[N]$ may denote $N^{th}$ row data, and $D_{PRE}[N]$ may denote $N^{th}$ precoded data. For convenience of description, precoded data may be referred to as precoding data. Data transmitted to the second device 102 may correspond to precoding data $D_{PRE}[N]$ instead of row data $D_{TX}[N]$.

According to an exemplary embodiment of the inventive concept, the first device 101 generates the precoding data $D_{PRE}[N]$ on the basis of $N^{th}$ row data $D_{TX}[N]$ and $N-1^{th}$ precoding data $D_{PRE}[N-1]$. For example, the XOR gate 210 may receive the $N^{th}$ row data $D_{TX}[N]$ as one input and may receive the $N-1^{th}$ precoding data $D_{PRE}[N-1]$, obtained by delaying precoding data by one period, as one other input. In an embodiment, an encoder (e.g., an encoding circuit) of the first device 101 generates the precoding data $D_{PRE}[N]$.

According to an exemplary embodiment, the first device 101 transmits precoded data instead of directly transmitting row data, and thus, the precoded data may be robust to noise. In a high-speed serial transceiver, a bandwidth may be limited based on a channel of the transmission line 105, and data received by the second device 102 may include random jitter and noise. Furthermore, in a case where data is transmitted at a high speed, distortion of a high frequency component may occur in a waveform received by the second device 102. Therefore, the precoding data $D_{PRE}[N]$ obtained by precoding the row data $D_{TX}[N]$ may be transmitted, thereby obtaining robustness to high frequency noise.

Figure 3:
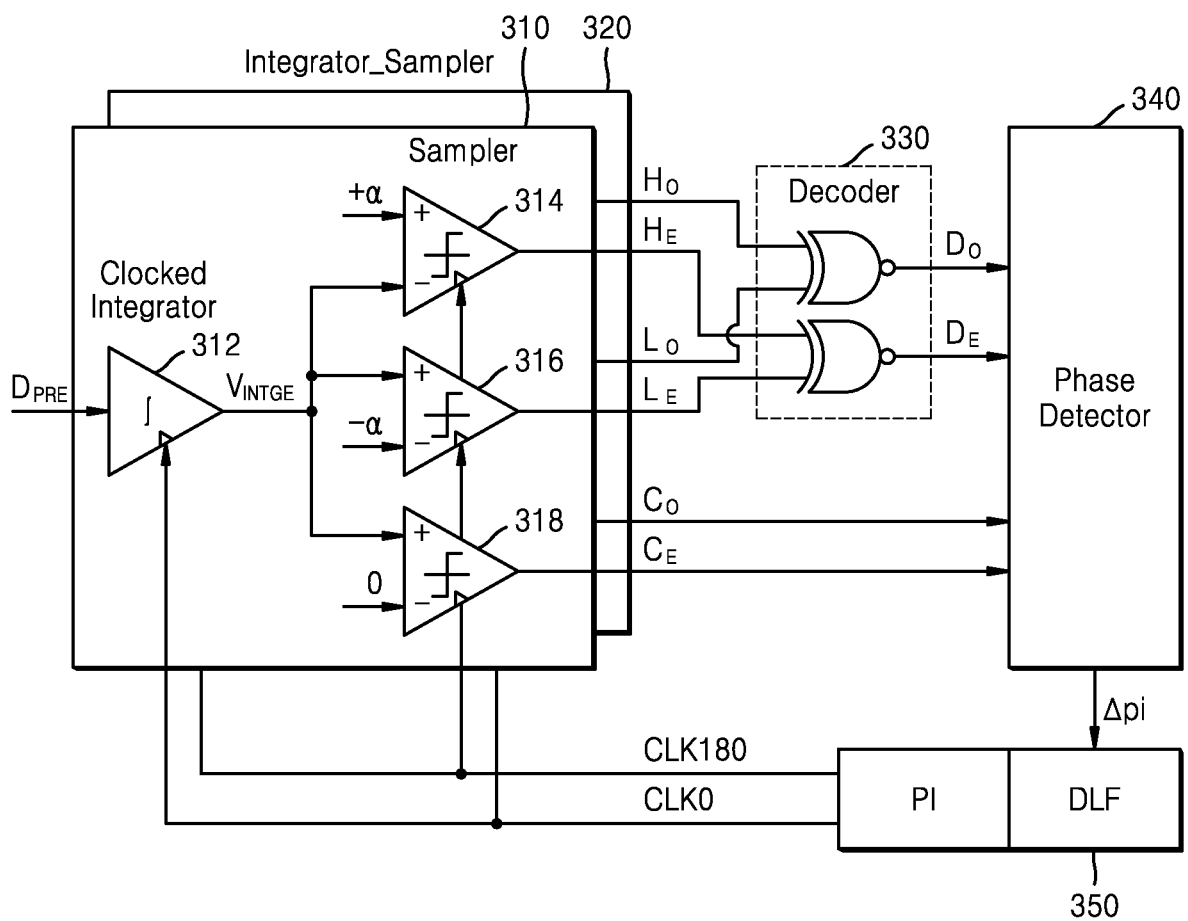
FIG. 3 illustrates a receiver of the system according to an exemplary embodiment of the inventive concept.

FIG. 3 illustrates a receiver 104 of the second device 102 according to an exemplary embodiment of the inventive concept. In detail, FIG. 3 illustrates a baud rate timing recovery circuit 106 of the receiver 104 of the second device 102.

Referring to FIG. 3, the baud rate timing recovery circuit 106 of the second device 102 includes integrator samplers 310 and 320 (e.g., sampling circuits), a phase detector 340 (e.g., a phase detection circuit), and a digital loop filter (DLF) 350. In an embodiment, the baud rate timing recovery circuit 106 further includes a decoder 330.

The integrator samplers 310 and 320 include an odd integrator sampler 310 and an even integrator sampler 320. The integrator samplers 310 and 320 may be referred to as integral samplers. In an embodiment, the second device 102 inputs a 0-degree first clock signal CLK0 to the odd integrator sampler 310 and a 180-degree second clock signal CLK180 to the even integrator sampler 320 to process two pieces of input data in parallel. For example, there may be 180-degree phase difference between the first and second clock signals. In an embodiment, the odd integrator sampler 310 is configured to process odd-numbered row data and the even integrator sampler 320 is configured to process even-numbered row data. For example, precoding data received by the receiver 104 during first, third, fifth time periods, etc. could be referred to as odd-numbered row data and precoding data received by the receiver 104 during second, fourth, sixth time periods, etc. could be referred to as even-numbered row data.

According to an exemplary embodiment, each integrator sampler (e.g., 310 or 320) includes an integrator 312 and a plurality of samplers. In an embodiment, the integrator 312 performs an integral on precoding data received from the first device 101. For example, the integrator 312 (e.g., an integrating circuit) may perform an integral from a middle time of 1 unit interval (UI) corresponding to $N^{th}$ precoding data and may perform an integral up to a middle time of 1 UI corresponding to $N+1^{th}$ precoding data. In an embodiment, the integrator 312 is implemented with an operational amplifier having a clock terminal that receives a corresponding of the clock signals (e.g., CLK0 or CLK180). In an embodiment, the integrator 312 performs an integral during a 1 UI from a middle point of data to generate a duo-binary signal. The duo-binary signal may denote a signal having three values such as +1, 0, and −1. In an exemplary embodiment, the plurality of samplers include a high sampler 314, a low sampler 316, and a compare sampler 318. At least one of the plurality of samplers may each have an offset (e.g., an offset value) having a certain level. For example, the high sampler 314 may sample an output value of the integrator 312 on the basis of a positive offset, the low sampler 316 may sample an output value of the integrator 312 on the basis of a negative offset, and the compare sampler 318 may sample an output value of the integrator 312 on the basis of a value of 0 (e.g., an offset of 0, no offset, or a 0 voltage). In an embodiment, a positive offset (e.g., +α) or voltage is provided as input to the high sampler 314 and a negative offset (e.g., −α) or voltage is provided as input to the low sampler 316. In an exemplary embodiment, each of the samplers 314, 316, and 318 is implemented by an operational amplifier having a clock terminal that receives one of the clock signals (e.g., CLK0 or CLK180). The output value of the integrator 312 of the odd integrator sampler 310 is an output value $V_{INTGE}$ and the output value of the integrator 312 of the even integrator sampler 320 is an output value $V_{INTGO}$.

According to an exemplary embodiment, the decoder 330 includes one or more XNOR gates. For example, the decoder 330 may include two XNOR gates, for processing values output from the odd integrator sampler 310 and the even integrator sampler 320. For example, one of the XNOR gates is used for processing values output by the odd integrator sampler 310 and the other of the XNOR gates is used for processing values output by the even integrator sampler 320. The decoder 330 may receive an output value from each of the high sampler 314 and the low sampler 316 and may perform an XNOR operation on the received output value to obtain output data.

According to an exemplary embodiment, the phase detector 340 receives a signal from the compare sampler 318 and determines whether data matches a clock (e.g., a clock signal) or the clock is earlier or later than the data. The phase detector 340 may determine whether the clock is locked (or is in-phase with the data) or is early or late, based on variations of output values of the compare sampler 318 received during 3 UI. This will be described below in detail.

In an exemplary embodiment, the phase detector 340 is configured to detect a phase difference between the precoding data and a clock signal from an output of the decoder 330 (e.g., decoded data) and an output of the compare sampler 318. The decoded data may be decoded data $D_O$ generated from odd-numbered row data or decoded data $D_E$ generated from even-numbered row data.

According to an exemplary embodiment of the inventive concept, the DLF 350 receives a phase error signal $\Delta pi$ and controls a phase of a clock (e.g., CLK0 and CLK180) so that the data and the clock are locked. When a value of the phase error signal $\Delta pi$ is 0, the DLF 350 may determine that locking is performed. The DLF 350 may receive the phase error signal $\Delta pi$ from the phase detector 340. In an exemplary embodiment, the DLF 350 does not adjust the clock when the value of $\Delta pi$ is 0, and adjusts the clock when the value of $\Delta pi$ is non-zero using the value.

Figure 4A:
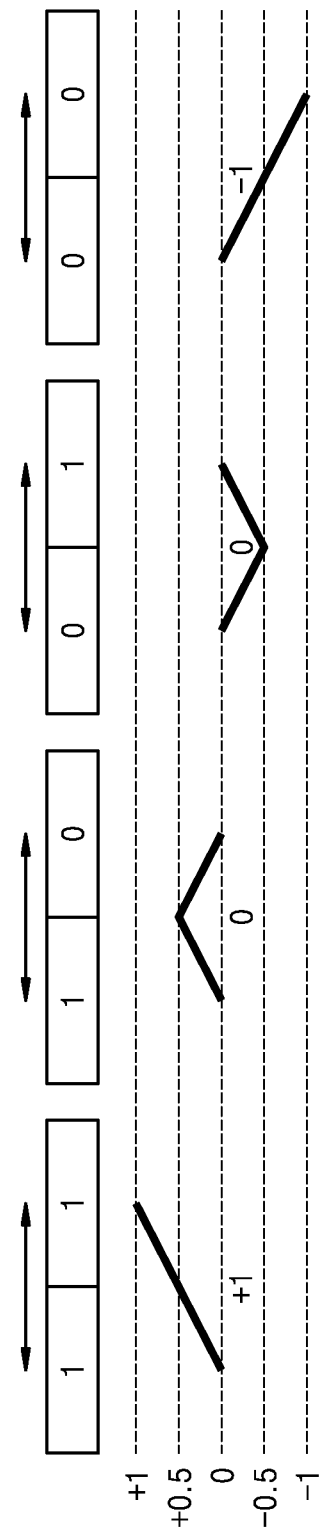
FIG. 4A illustrates an example of a duo-binary signal output according to an embodiment of the inventive concept.

FIG. 4A illustrates an example of a duo-binary signal output according to an exemplary embodiment of the inventive concept. FIG. 4A illustrates four sets of data, where each set includes N-1$^{th}$ data and N$^{th}$ data.

Referring to FIG. 4A, the integrator 312 may perform an integral during 1 UI. A UI may be a unit interval and may denote a time interval which is occupied by a shortest unit bit. In an embodiment, only one bit data is transmitted during 1 UI.

According to an exemplary embodiment, the integrator 312 of FIG. 3 may not start to perform an integral from a start time of data reception and may perform an integral from a middle time of data reception. That is, a time at which an integral is performed may correspond to a time where a reception start time of data is shifted by 0.5 UI.

In a case where an integral is performed from a middle point of data, an output of the integrator 312 may correspond to a duo-binary signal. That is, the output of the integrator 312 may correspond to +1, 0, or -1.

For example, N-1$^{th}$ data may be 1 or logic high, and moreover, N$^{th}$ data may be 1 or logic high. In this case, the integrator 312 may perform an integral on a positive value during 1 UI, and thus, an output of the integrator 312 may be +1. Hereinafter, an input data pattern for allowing the output of the integrator 312 to be +1 may be referred to as a first pattern.

As another example, when the N-1$^{th}$ data is 0 or logic low and the N$^{th}$ data is 1 or logic high, the output of the integrator 312 may correspond to 0. That is, an integral value may decrease by performing an integral on the N-1$^{th}$ data and then may increase by performing an integral on the N$^{th}$ data (e.g., integrating the N$^{th}$ data), and thus, the output of the integrator 312 may be 0. Similarly, when the N-1$^{th}$ data is 1 or logic high and the N$^{th}$ data is 0 or logic low, the output of the integrator 312 may correspond to 0. Hereinafter, in an input data pattern for allowing the output of the integrator 312 to be 0, a data pattern where a continuous input data pattern is (1, 0) may be referred to as a second pattern, and a data pattern where a continuous input data pattern is (0, 1) may be referred to as a third pattern.

As another example, when each of the N-1$^{th}$ data and the N$^{th}$ data is 0 or logic low, the output of the integrator 312 may continuously decrease, and thus, may correspond to -1. Hereinafter, an input data pattern for allowing the output of the integrator 312 to be -1 may be referred to as a fourth pattern.

Figure 4B:
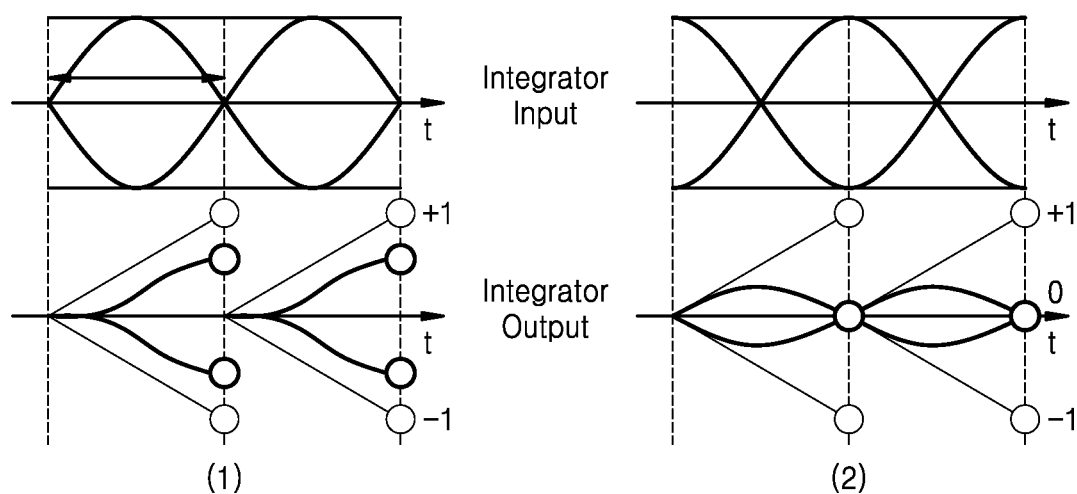
FIG. 4B illustrates an example of an input and an output of an integrator according to an exemplary embodiment of the inventive concept.

FIG. 4B illustrates an example of an input and an output of an integrator according to an exemplary embodiment of the inventive concept.

Referring to FIG. 4B, part (1) of FIG. 4B illustrates each of an input and an output of the integrator 312 when an integral is performed from a time at which data is received, and part (2) of FIG. 4B (2) illustrates each of an input and an output of the integrator 312 when an integral is performed from a middle time at which data is received.

Referring to part (1) of FIG. 4B, in a case where an integral is performed from the reception start of data, an output of the integrator 312 may be +1, 0, and -1, and moreover, may be values instead of an arbitrary integer. When data input to the integrator 312 is not received at a time at which the data matches a clock, inter symbol interference (ISI) may occur, and thus, the integrator 312 may output an arbitrary value (for example, +0.8) between +1 and 0 or an arbitrary value (for example, -0.8) between 0 and -1.

Referring to part (2) of FIG. 4B, the integrator 312 performs an integral from a middle point of data reception. That is, compared with part (1) of FIG. 4B, a time at which an integral is performed corresponds to a time where a reception start time of data is shifted by 0.5 UI. For example, the integrator 312 may perform an integral up to a middle point of N$^{th}$ data from a middle point of N-1$^{th}$ data. In part (2) of FIG. 4B, a length of a time period where the integrator 312 performs an integral may be 1 UI. That is, the integrator 312 may perform an integral during 1 UI up to the middle point of the N$^{th}$ data from the middle point of the N-1$^{th}$ data, and thus, it may be seen that, when an integral output value is +1, each of the N-1$^{th}$ data and the N$^{th}$ data is 1 or logic high, and when the integral output value is -1, each of the N-1$^{th}$ data and the N$^{th}$ data is 0 or logic low. However, when the integral output value is 0, it may be seen that a transition occurs between the N-1$^{th}$ data and the N$^{th}$ data, and it may be unable to determine a detailed value of each of the N-1$^{th}$ data and the N$^{th}$ data.

Figure 5:
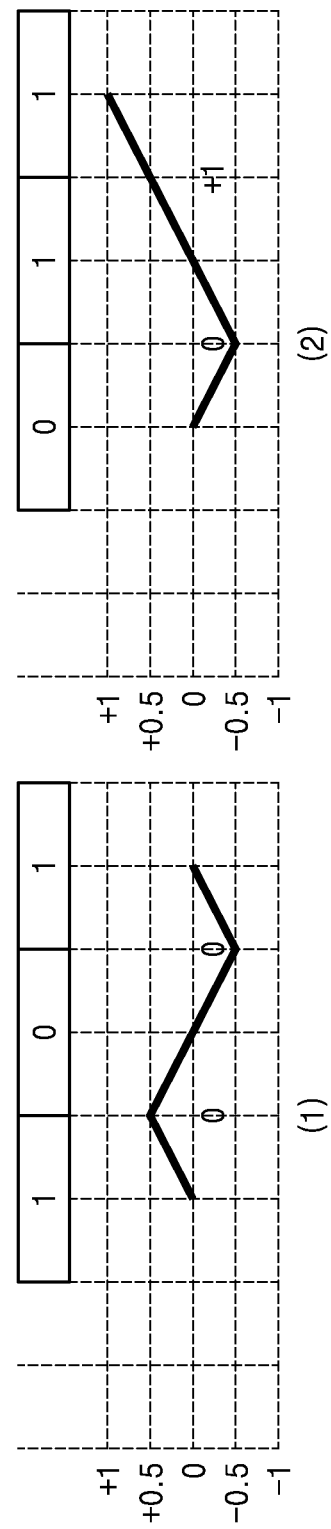
FIG. 5 illustrates another example of a duo-binary signal output according to an embodiment of the inventive concept.

FIG. 5 illustrates another example of a duo-binary signal output according to an exemplary embodiment of the inventive concept.

Referring to FIG. 5, a result value of an integral performed by the integrator 312 of FIG. 3 during 2 UI is illustrated.

According to an exemplary embodiment, the integrator 312 determines an output value of previous data on the basis of a result value of an integral performed during 2 UI. As described above with reference to FIG. 4B, when a result value of an integral performed during 1 UI is +1 and −1, it may be seen that each of N−1$^{th}$ data and N$^{th}$ data is 1 or 0.

Referring to part (1) of FIG. 5, according to an exemplary embodiment, the integrator 312 continuously outputs result values "0" of an integral performed during 2 UI. In a case where "0" is output from the integrator 312 during 1 UI, it is determined that a transition of data occurs, but in a case where "0" is output from the integrator 312 during 2 UI, the N−1$^{th}$ data is determined. For example, when N−1$^{th}$ to N+1$^{th}$ data are (1, 0, 1), all of outputs of the integrator 312 during 2 UI are "0". Therefore, when all of outputs of the integrator 312 during 2 UI are "0", it is determined that the N−−1$^{th}$ data is "1".

Referring to part (2) of FIG. 5, according to an exemplary embodiment, integral result values are shifted from "0" to "1" during 2 UI. For example, when N−1$^{th}$ to N+1$^{th}$ data are (0, 1, 1), an output of the integrator 312 is shifted from "0" to "1" during 2 UI. It may be seen that, because an output value corresponding to the second UI is "1", each of N$^{th}$ data and N+1$^{th}$ data is "1", and because an output value corresponding to the first UI is "0", N−1$^{th}$ data is "0". That is, when a result value output from the integrator 312 during 2 UI is shifted from "0" to "1", it is determined that a value of previous data is "0".

FIG. 6A illustrates an example where error propagation occurs, and FIG. 6B illustrates an example where error propagation does not occur, according to embodiments of the inventive concept.

Referring to FIG. 6A, the data transmitting and receiving system 100 bypasses a precoding operation. That is, referring to a table of FIG. 6A, it may be seen that there is only row data $D_{TX}$, and there is no precoding data $D_{PRE}$. Hereinafter, for convenience of description, pieces of data may be referred to as zeroth data to tenth data in a sequence from the left.

Referring to FIG. 6A, an error occurs in an output value of the integrator 312 corresponding to third data. That is, it may be seen that, because each of second data and the third data is "1", an output value of the integrator 312 has to increase continuously and thus has to be "1", but because a value of "0" is output, an error occurs.

Because an output value of the integrator 312 is abnormally output as "0" instead of "1", each of values output from the high sampler 314 and the low sampler 316 is determined to be "1". The high sampler 314 of the odd integrator sampler 310 may provide an output $H_O$ and the high sampler 314 of the even integrator sampler 320 may provide an output $H_E$. The low sampler 316 of the odd integrator sampler 310 may provide an output $L_O$ and the low sampler 316 of the even integrator sampler 320 may provide an output $L_E$. Therefore, because each of inputs of the decoder 330 is "1", a data output value based on an XNOR operation is "0", and thus, has a value differing from "1", which is the third input data. When an error occurs in a third data value, a current data value may be seen based on a previous data value, and thus, it may be seen that an error occurs continuously from fourth output data.

Referring to FIG. 6B, an error occurs in third, seventh, and tenth output values of the integrator 312. That is, in the third output value of the integrator 312, it may be seen that, because second precoding data is "1" and third precoding data is "0", "0" has to be output, but an error where "−1" is output occurs. Because sixth precoding data is "1" and seventh precoding data is "0", the seventh output value of the integrator 312 is based on the same reason as an error of the third output value. In the tenth output value of the integrator 312, it may be seen that each of ninth precoding data and tenth precoding data is "1". Therefore, in the tenth output value of the integrator 312, it may be seen that "1" has to be output, but "0" is abnormally output.

As described above, N$^{th}$ precoding data $D_{PRE}[N]$ may be generated by performing an XOR operation after N$^{th}$ input data $D_{TX}[N]$ and N−1$^{th}$ precoding data $D_{PRE}[N−1]$ are delayed. By performing encoding of input data and precoding data corresponding to a previous time, a certain value may be output regardless of a data value corresponding to the previous time. For example, even when an error occurs in the third output value of the integrator 312, normal values may be output without the occurrence of an error in fourth to sixth output values. That is, the data transmitting and receiving system 100 may perform precoding on input data, thereby preventing error propagation.

Figure 7A:
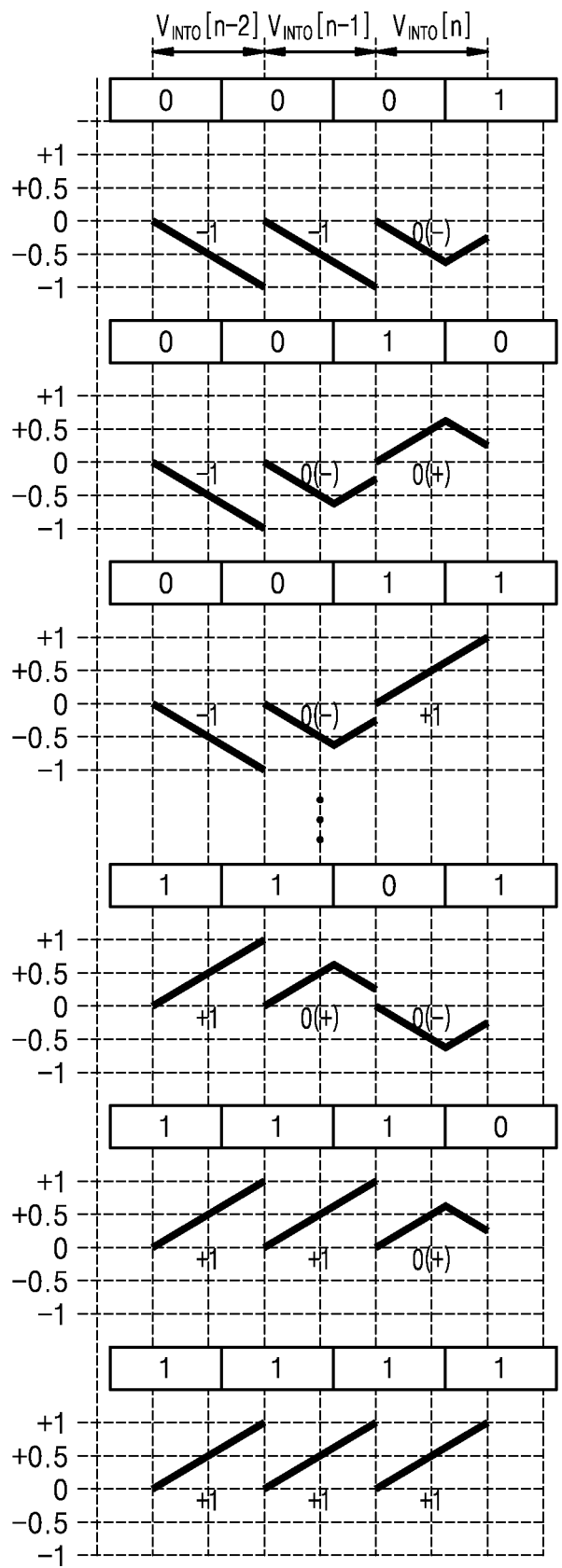
FIG. 7A illustrates another example which determines a delay or absence of delay of a clock in a phase detector according to embodiments of the inventive concept.

FIG. 7A illustrates another example which determines a delay or absence of delay of a clock in a phase detector 340 according to embodiments of the inventive concept.

Referring to FIG. 7A, the phase detector 340 determines whether a clock precedes data, based on three or more data patterns. Hereinafter, a case where a clock precedes data may be referred to as an early clock.

According to an exemplary embodiment, the phase detector 340 is configured to identify three or more data patterns. Here, a data pattern may denote an output waveform of the integrator 312 corresponding to continuous input data. For example, when pieces of continuous input data are (1, 1), an output waveform of the integrator 312 is a waveform which increases with a certain slope and corresponds to a first pattern described above with reference to FIG. 4A. For example, when pieces of continuous input data are (1, 0), an output waveform of when the integrator 312 performs an integral on data "1" is an output waveform which increases based on a certain slope and then decreases based on a certain slope while integrator 312 is performing an integral on data "0". This may correspond to a second pattern described above with reference to FIG. 4A.

According to an exemplary embodiment, an early clock may denote a case where a time, at which the integrator 312 performs an integral, precedes a middle point of data. When the integrator 312 performs an integral on the basis of the early clock, an output value may not match a duo-binary signal. That is, an output value corresponding to an integral performed by the integrator 312 during 1 UI may be a value (for example, −0.1) between −1 and 0 or a value (for example, +0.1) between 0 and 1, instead of an integer of +1, 0, or −1. According to an exemplary embodiment, when a clock is earlier than a middle point of data, a value output from the integrator 312 is farther away from 0. Hereinafter, for convenience of description, a case where a value between −1 and 0 is output is referred to as "0$^−$", and a case where a value between 0 and +1 is output is referred to as "0$^+$".

Referring to FIG. 7A, the integrator 312 performs an integral on input data "0001". By performing an integral on four continuous bits, the phase detector 340 receives three data patterns corresponding to 3 UI. First and second UI periods correspond to a result of an integral performed on data (0, 0), and thus, a waveform of the first UI period is a waveform which decreases based on a certain slope. A waveform of a third UI period corresponds to a result of an integral performed on data (0, 1), and thus, is a waveform which decreases and then increases, based on a certain slope.

When data matches a clock, a length of a period where an integral value decreases is the same as that of a period where the integral value increases, and thus, an output value is 0.

However, in an early clock, the integrator 312 performs an integral prior to a middle point of data, and thus, a period length of a waveform, where an integral value decreases, of a 3 UI period is greater than a period length of a waveform, where an integral value increases, of the 3 UI period. That is, a period where an integral is performed on input data "1" is short, and thus, an output of the integrator 312 more accurately corresponds to "0⁻" close to "0", instead of "0". When a value of a data pattern is (−1, −1, 0⁻), the phase detector 340 identifies that a mismatch between data and a clock occurs and a current state is an early clock state.

As another example, the integrator 312 performs an integral on input data "1110". By performing an integral on four continuous bits, the phase detector 340 receives three data patterns corresponding to 3 UI. First and second UI periods correspond to a result of an integral performed on data (1, 1), and thus, a waveform of the first UI period is a waveform which increases based on a certain slope. A waveform of a third UI period corresponds to a result of an integral performed on data (1, 0), and thus, corresponds to a waveform which increases and then decreases, based on a certain slope. However, in an early clock, the integrator 312 may perform an integral prior to a middle point of data, and thus, a period length of a waveform, where an integral value increases, of a 3 UI period may be greater than a period length of a waveform, where an integral value decreases, of the 3 UI period. That is, a period where an integral is performed on input data "0" may be short, and thus, an output of the integrator 312 more accurately corresponds to "0⁺" close to "0", instead of "0". When a value of a data pattern is (+1, +1, 0⁺), the phase detector 340 identifies that a mismatch between data and a clock occurs and a current state is an early clock state.

Figure 7B:
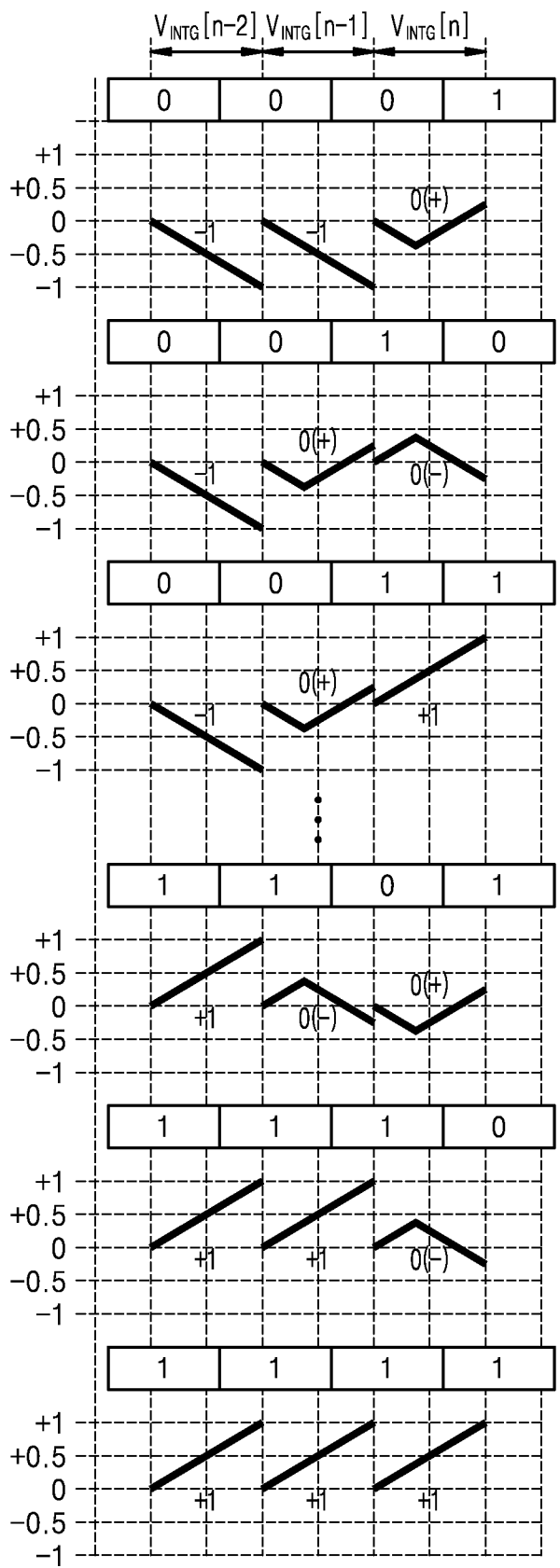
FIG. 7B illustrates another example which determines the delay or absence of delay of a clock in a phase detector according to embodiments of the inventive concept.

FIG. 7B illustrates another example which determines a delay or an absence of a delay of a clock in a phase detector 340 according to embodiments of the inventive concept.

Referring to FIG. 7B, the phase detector 340 determines whether a clock follows data, based on three or more data patterns. Hereinafter, a case where a clock follows data may be referred to as a late clock.

According to an exemplary embodiment, a late clock may denote a case where a time, at which the integrator 312 performs an integral, follows a middle point of data. In a case where the integrator 312 performs an integral on the basis of the late clock, an output value may be "0⁻" or "0⁺".

Referring to FIG. 7B, the integrator 312 performs an integral on input data "0001". By performing an integral on four continuous bits, the phase detector 340 receives three data patterns corresponding to 3 UI. First and second UI periods correspond to a result of an integral performed on data (0, 0), and thus, a waveform of the first UI period is a waveform which decreases based on a certain slope. A waveform of a third UI period corresponds to a result of an integral performed on data (0, 1), and thus, is a waveform which decreases and then increases, based on a certain slope.

When data matches a clock, a length of a period where an integral value decreases is the same as that of a period where the integral value increases, and thus, an output value is 0. However, in a late clock, the integrator 312 may performs an integral later than a middle point of data, and thus, a period length of a waveform, where an integral value increases, of a 3 UI period is greater than a period length of a waveform, where an integral value decreases, of the 3 UI period. That is, a period where an integral is performed on input data "0" may be shorter than a period where an integral is performed on input data "1", and thus, an output of the integrator 312 more accurately corresponds to "0⁺" close to "0", instead of "0". When a value of a data pattern is (−1, −1, 0⁺), the phase detector 340 identifies that a mismatch between data and a clock occurs and a current state is a late clock state.

As another example, the integrator 312 performs an integral on input data "1110". By performing an integral on four continuous bits, the phase detector 340 receives three data patterns corresponding to 3 UI. First and second UI periods may correspond to a result of an integral performed on data (1, 1), and thus, a waveform of the first UI period is a waveform which increases based on a certain slope. A waveform of a third UI period may correspond to a result of an integral performed on data (1, 0), and thus, is a waveform which increases and then decreases, based on a certain slope. However, in a late clock, the integrator 312 may performs an integral later than a middle point of data, and thus, a period length of a waveform, where an integral value decreases, of a 3 UI period is greater than a period length of a waveform, where an integral value increases, of the 3 UI period. That is, a period where an integral is performed on input data "1" is shorter than a period where an integral is performed on input data "0", and thus, an output of the integrator 312 more accurately corresponds to "⁻" close to "0", instead of "0". When a value of a data pattern is (+1, +1, 0⁻), the phase detector 340 identifies that a mismatch between data and a clock occurs and a current state is a late clock state.

Referring to FIGS. 7A and 7B, the phase detector 340 determines whether a clock is an early clock or a late clock, based on transition of a value of a data pattern, a value "0⁺", and a value "0⁻". However, as illustrated in FIGS. 7A and 7B, in a data pattern (for example, a data pattern (+1, +1, +1)) which does not include a value "0⁺" and a value "0⁻", whether a clock is an early clock or a late clock is not determined.

FIG. 8 illustrates a table for determining the delay or an absence of delay of a clock in a phase detector 340 according to embodiments of the inventive concept.

Referring to FIG. 8, the phase detector 340 may store a table for determining whether a current clock is an early clock or a late clock, based on three data patterns. For example, the phase detector 340 may include a memory that stores the table.

According to an exemplary embodiment, referring to FIG. 3, the phase detector 340 receives output data from the decoder 330 and an integral output value from the compare sampler 318. The compare sampler 318 of the odd integrator sampler 310 may provide an output $C_O$ and the compare sampler 318 of the even integrator sampler 320 may provide an output $C_E$. When three or more integral output values are received, the phase detector 340 may determine whether a current clock is an early clock or a late clock. For example, when the three integral values (i.e., three data patterns) are (+1, 0⁺, −1), an E/L/H value corresponding to the three data patterns in the table is "early", and thus, it may be seen that the current clock is an early clock.

As another example, when the three data patterns are (0⁺, 0⁻, −1), an E/L/H value corresponding to the three data patterns in the table is "late", and thus, it may be seen that the current clock is a late clock.

In the above-described embodiments, it is illustrated that the phase detector 340 determines the early clock or the late clock on the basis of the three or more data patterns, but the inventive concept is not limited thereto. For example, the phase detector 340 may determine the early clock or the late clock on the basis of two data patterns. In a case where delay or absence of delay of a clock is determined based on a data pattern, when there is transition (for example, transition from 1 to 0 or transition from −1 to 0) of input data, the phase detector 340 may determine whether a current clock is the early clock or the late clock. Therefore, in a case where the early clock or the late clock is determined based on two data patterns, a probability of the transition may be 50%, and due to this, the performance of phase detection may be slightly reduced. On the other hand, in a case where the early clock or the late clock is determined based on two data patterns, the complexity of the phase detector 340 may be greatly reduced.

As another example, the phase detector 340 may determine the delay or absence of delay of a clock on the basis of four or more data patterns. As the number of referred data patterns increases, a possibility for identifying the shift of an output value of the integrator 312 may increase, and thus, a probability of phase detection may increase. On the other hand, whenever the number of data patterns increases by one, the number of entries of the illustrated early/late table may exponentially increase, and thus, a size of a circuit needed for implementing the phase detector 340 may increase.

Figure 9:
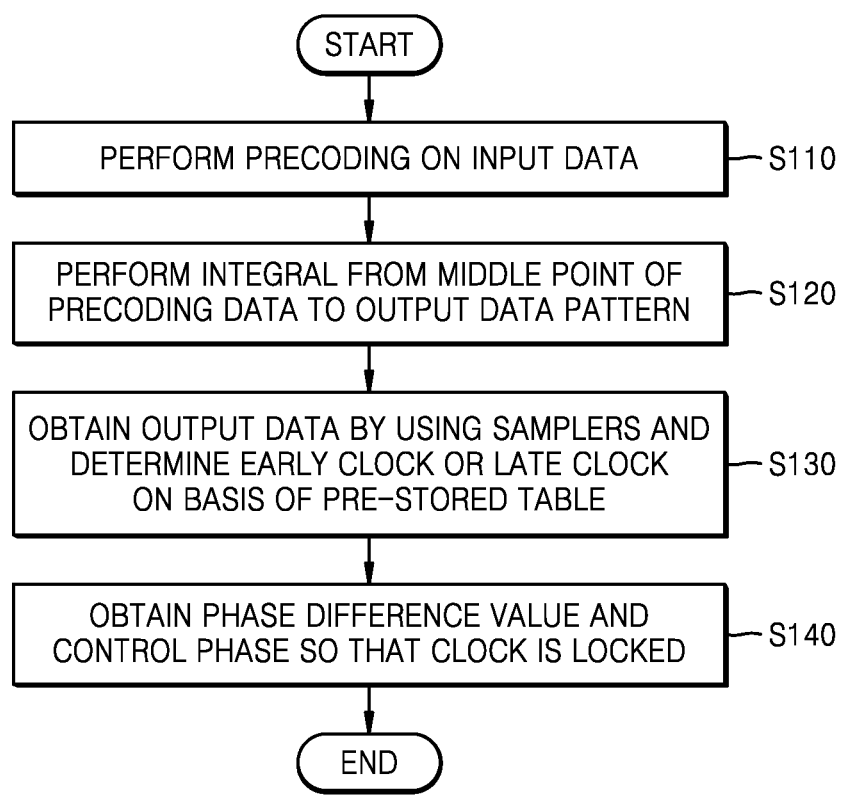
FIG. 9 illustrates an operating method of a data transmitting and receiving system, according to embodiments of the inventive concept.

FIG. 9 illustrates an operating method of a data transmitting and receiving system, according to an exemplary embodiment of the inventive concept.

Referring to FIG. 9, in operation S110, the first device 101 performs precoding on input data. In an exemplary embodiment, the first device 101 delays N–1$^{th}$ transmitted precoding data by one clock to generated delayed data, performs an XOR operation on N$^{th}$ input data and the delayed data, and outputs a result value of the XOR operation as N$^{th}$ precoding data to the second device 102.

In operation S120, the second device 102 performs an integral from a middle point of precoding data by using the integrator 312 to output a data pattern. Here, the data pattern may denote a value which is output by the integrator 312 at every unit interval.

In operation S130, the second device 102 obtains output data by using a plurality of samplers, and the phase detector 340 determines an early clock or a late clock on the basis of a pre-stored table. As illustrated in FIG. 8, the phase detector 340 may determine a corresponding early clock or a corresponding late clock for each data pattern which is output during three unit intervals, based on the pre-stored table.

In operation S140, the second device 102 obtains a phase difference value from the phase detector 340, and adjusts a clock based on the obtained phase difference so that the clock matches data. The second device may control a DLF to adjust the clock using the phase difference.

While the inventive concept has been particularly shown and described with reference to embodiments thereof, it will be understood that various changes in form and details may be made therein without departing from the spirit and scope of the disclosure.

What is claimed is:

1. A data transmitting and receiving system comprising:
a first device including an encoder configured to encode row data to generate precoding data and a transmitter configured to transmit the precoding data through a transmission channel; and
a second device including an integrator configured to perform an integral on the precoding data, an integral sampler including a plurality of samplers configured to output sampling data based on an offset value and an output value of the integrator, a decoder configured to decode outputs of some of the samplers to generate decoded data, and a phase detector configured to detect a phase difference between the precoding data and a clock based on the decoded data and an output of another one of the samplers.

2. The data transmitting and receiving system of claim 1, wherein the precoding data is obtained by performing an XOR operation on row data corresponding to a current time and precoding data corresponding to a previous time.

3. The data transmitting and receiving system of claim 1, wherein the integral sampler further comprises an odd integral sampler configured to process odd-numbered row data and an even integral sampler configured to process even-numbered row data, and
the odd-numbered row data and the even-numbered row data are processed in parallel.

4. The data transmitting and receiving system of claim 1, wherein the samplers comprise:
a high sampler configured to perform sampling based on a positive offset value and the output value of the integrator;
a low sampler configured to perform sampling based on a negative offset value and the output value of the integrator; and
a compare sampler configured to perform sampling based on the output value of the integrator.

5. The data transmitting and receiving system of claim 4, wherein the offset value is 0.5.

6. The data transmitting and receiving system of claim 4, wherein the decoder further comprises an XNOR gate, and
the decoder is configured to perform an XNOR operation on values output from the high sampler and the low sampler to generate the decoded data.

7. The data transmitting and receiving system of claim 4, wherein the phase detector is configured to determine whether a current clock precedes or follows input data, based on output values which are output from the compare sampler and corresponding to at least three unit intervals.

8. The data transmitting and receiving system of claim 7, wherein all combinations capable of being generated from the output values corresponding to the at least three unit intervals are stored in a table and the phase detector uses the table for determining whether the current clock precedes or follows the input data.

9. The data transmitting and receiving system of claim 1, wherein the integrator is configured to perform an integral during a period of a unit interval from a middle point of the received precoding data up to a middle point of precoding data received subsequent thereto.

10. The data transmitting and receiving system of claim 1, wherein the first device is implemented in an output end of a dynamic random-access memory (DRAM), and the second device is implemented in a receiving end of a processing unit.

11. An operating method of a data transmitting and receiving system including a first device and a second device, the operating method comprising:
transmitting, by using the first device, precoding data encoded from row data;
performing, by an integrator of the second device, an integral on the precoding data;
generating, by samplers of the second device, sampling data based on an output value of the integrator and an offset value;
decoding, by a decoder of the second device, outputs of some of the samplers to generate decoded data; and detecting, by the second device, a phase difference between the precoding data and a clock based on the decoded data and an output of another one of the samplers.

12. The operating method of claim 11, wherein the precoding data is encoded by:
receiving row data corresponding to a current time; and
performing an XOR operation on the row data and precoding data corresponding to a previous time.

13. The operating method of claim 11, wherein the performing of the integral on the precoding data, the generating of the sampling data, and the decoding of the outputs are performed on even-numbered row data and odd-numbered row data in parallel.

14. The operating method of claim 11, wherein the samplers comprise:
a high sampler configured to perform sampling based on a positive offset value and the output value of the integrator;
a low sampler configured to perform sampling based on a negative offset value and the output value of the integrator; and
a compare sampler configured to perform sampling based on the output value of the integrator.

15. The operating method of claim 14, wherein the offset value is 0.5.

16. The operating method of claim 14, wherein the decoder further comprises an XNOR gate, and
the decoding comprises performing an XNOR operation on values output from the high sampler and the low sampler.

17. The operating method of claim 14, wherein the detecting of the phase difference comprises determining whether a current clock precedes or follows input data, based on output values which are output from the compare sampler and correspond to at least three unit intervals.

18. The operating method of claim 17, wherein all combinations capable of being generated from the output values corresponding to the at least three unit intervals are stored in a table and the phase detector uses the table for determining whether the current clock precedes or follows the input data.

19. The operating method of claim 11, wherein the performing of the integral on the precoding data comprises performing an integral during a period of a unit interval from a middle point of the received precoding data up to a middle point of precoding data received subsequent thereto.

20. The operating method of claim 11, wherein the first device is implemented in an output end of dynamic random access memory (DRAM), and the second device is implemented in a receiving end of a processing unit.

* * * * *